United States Patent [19]

Schwamm et al.

[11] Patent Number: 5,677,514
[45] Date of Patent: Oct. 14, 1997

[54] METAL-CORE PC BOARD FOR INSERTION INTO THE HOUSING OF AN ELECTRONIC DEVICE

[75] Inventors: Friedrich Schwamm, Zorneding; Kurt Ding, Augsburg, both of Germany

[73] Assignee: MTU Motoren- Und Turbinen-Union Muenchen GmbH, Munich, Germany

[21] Appl. No.: 624,558

[22] PCT Filed: Sep. 26, 1994

[86] PCT No.: PCT/EP94/03206

§ 371 Date: Apr. 8, 1996

§ 102(e) Date: Apr. 8, 1996

[87] PCT Pub. No.: WO95/10172

PCT Pub. Date: Apr. 13, 1995

[30] Foreign Application Priority Data

Oct. 7, 1993 [DE] Germany ............ 43 34 127.6

[51] Int. Cl.$^6$ ................................ H05K 1/05
[52] U.S. Cl. ........................ 174/252; 174/255
[58] Field of Search ..................... 174/250, 252, 174/255; 361/784, 790, 792, 720, 723, 724

[56] References Cited

U.S. PATENT DOCUMENTS 3,405,227  10/1968  Hazlett .................... 361/792
3,475,656  10/1969  Hepker .................... 174/255
4,916,575   4/1990  Van Asten ............... 174/16.3

FOREIGN PATENT DOCUMENTS

| 0 124 128 | 11/1984 | European Pat. Off. . |
| 88 11 949.1 | 12/1988 | Germany . |
| 62-214632 | 9/1987 | Japan . |
| 51-09919 | 4/1993 | Japan . |

*Primary Examiner*—Hyung S. Sough
*Assistant Examiner*—Paramita Ghosh
*Attorney, Agent, or Firm*—Evenson, McKeown, Edwards & Lenahan, P.L.L.C.

[57] ABSTRACT

A PC board to be populated with electronic components, for insertion into the housing of an electronic device, has a core made of two metal plates connected together and spaced apart by reinforcing ribs, said plates being provided with a copper-invar layer and with a cover layer formed by several layers of polyimide film. To achieve high rigidity and good heat transfer, the metal plates are made of aluminum or an aluminum alloy and are fastened in the housings by means of gibs and cotters.

11 Claims, 2 Drawing Sheets

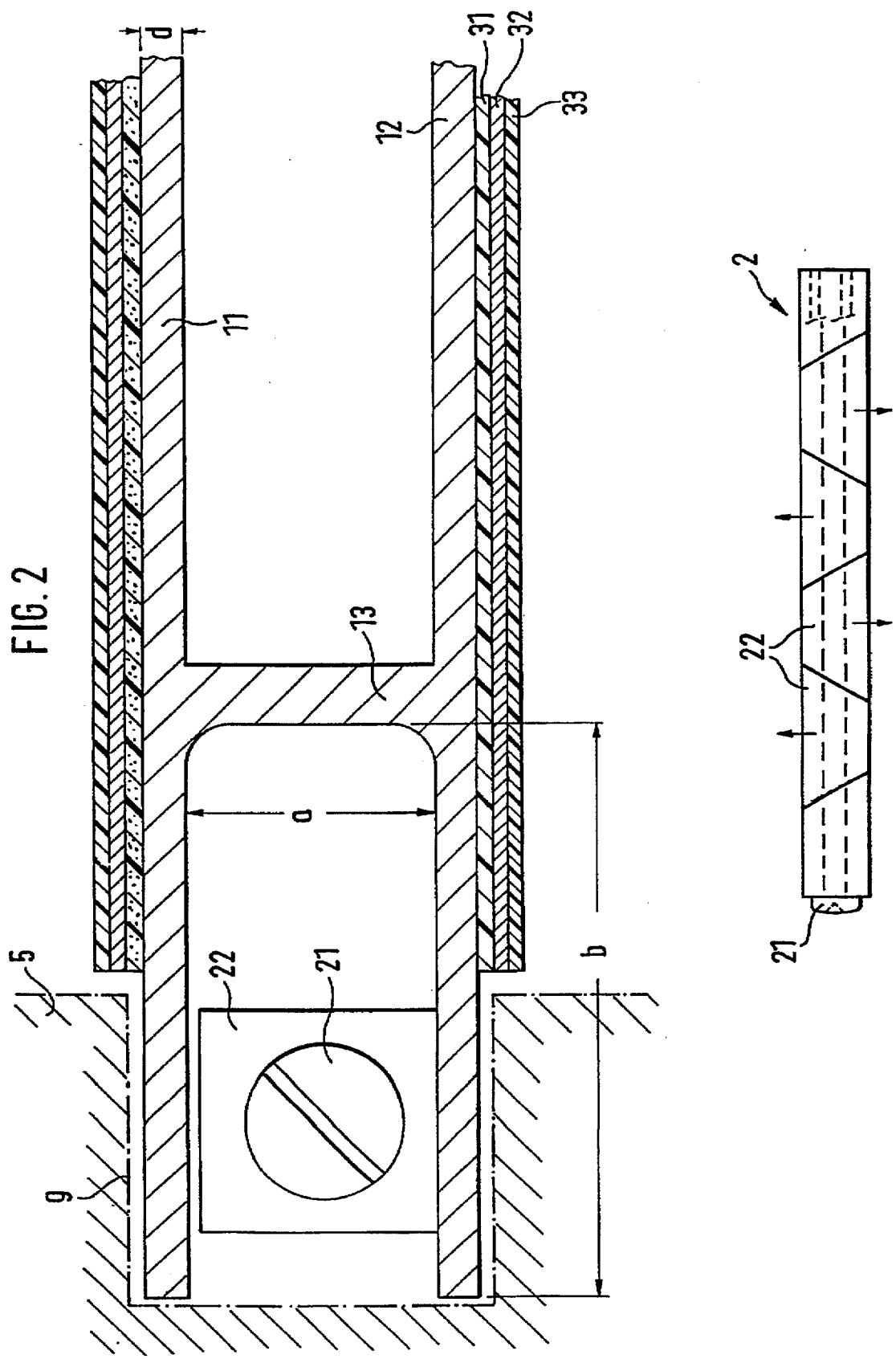

METAL-CORE PC BOARD FOR INSERTION INTO THE HOUSING OF AN ELECTRONIC DEVICE

BACKGROUND AND SUMMARY OF THE INVENTION

The invention relates to a metal-core PC board for insertion into the housing of an electronic device. The core consists of two metal plates joined together and spaced apart by metal ribs, on the outer surfaces of which core multilayer insulating layers are provided. The marginal areas of at least two opposite lateral edges of the metal-core PC board are not coated.

The requirements for such metal-core PC boards, which are usually populated with electronic components, specify in particular, that the heat generated during operation of the electronic components can be conducted away well, that high dimensional stability of the board is thus guaranteed so as not to endanger the printed conductors, and that low weight is also achieved to make the electronic devices equipped with the boards correspondingly light.

A metal-core PC board for insertion into a housing of an electronic device, with the core consisting of two metal plates spaced apart from one another and connected together by metal ribs, with multilayer insulating layers being provided on the outer surfaces of the core, and with the marginal areas of at least two opposite lateral edges of the metal-core PC board not being coated (sliding margins) is known from European Patent document EP-0 124 128 A1.

A metal-core PC board is also known from German Patent document DE-88 11 949 U1 whose edges can be clamped by a spreading device to secure them in a housing. In this known board, heat is advantageously conducted away from the metal-core PC board into the housing.

It has been shown that individual measures like those known from the European publication EP-0 124 128 A1 which constitutes the species or from the German publication DE-88 11 949 U1 are insufficient to meet the requirements imposed on metal-core PC boards regarding high dimensional stability, low weight, and good heat dissipation.

Hence the goal of the present invention is to provide a metal-core PC board of the above-mentioned type which exhibits high dimensional stability when exposed to temperature differentials, allows optimal heat dissipation through the housing, and is also low in weight.

This goal is achieved according to the present invention by a metal-core PC board for insertion into a housing of an electronic device, with the core consisting of two metal plates spaced apart from one another and connected together by metal ribs, with multilayer insulating layers being provided on the outer surfaces of the core, and with the marginal areas of at least two opposite lateral edges of the metal-core PC board not being coated (sliding margins). The core consists of aluminum or an aluminum alloy. Copper-invar (nickel steel) layers are applied to the outer surfaces of the core. A polyimide insulating layer composed of several layers is applied to the copper-invar layers. The marginal areas, i.e., the sliding margin (g), is free of ribs and the corresponding metal plates can be spread apart in the vicinity of the sliding margin (g) through the use of gibs and cotters.

By making the metal core of aluminum or an aluminum alloy, especially good heat conduction and hence heat dissipation is achieved. The stiffening ribs serve for heat compensation. By placing the plastic cover layer on top of the copper-invar layer, improved heat conduction into the metal core and from the latter to the housing is achieved.

The thickness, spacing, and number of the metal plates or plastic films are preferably chosen as will be described herein.

Securing the metal-core PC board in the housing through the use of a gib and cotter in an area of the sliding margin that is kept free of any reinforcing ribs contributes to the heat transfer between the metal-core PC board and the housing due to the increased bilateral fit of the metal plates against the grooved wall of the housing.

In a preferred embodiment of the invention, the gib and cotter is fastened to one of the metal plates. By fastening the gib and cotter to one of the metal plates, the need for manual adjustment is eliminated when clamping it in place, and such fastening provides protection against loss.

One embodiment of the metal-core PC board according to the invention will now be described with reference to the attached drawings.

BRIEF DESCRIPTION OF THE DRAWINGS

FIG. 2 is a partial section view through the PC board along Line II—II in FIG. 1.

DETAILED DESCRIPTION OF THE DRAWINGS

Figure 1:
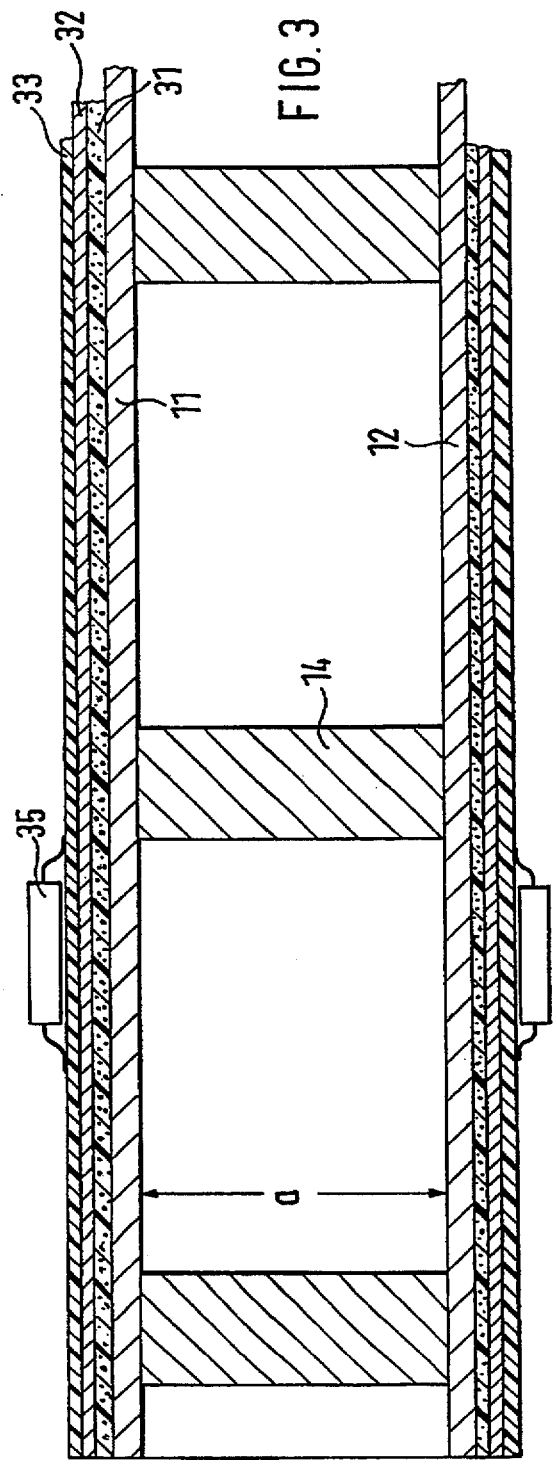
FIG. 1 is a schematic top view of a metal-core PC board according to the invention.

In FIG. 1, the metal-core PC board, shown in a top view, is designated generally by 1. The board 1 shown is rectangular in shape; however, a different contour is also possible. However, two parallel straight lateral edges must always be provided opposite one another to permit the sliding of the board into a suitable housing with parallel guides. The large edge length of the board is designated L. A cover layer 33 on the board, made of polyimide film, is made shorter than the length L of the long edge, so that the two opposite short lateral edges each have a sliding margin g which is kept free of coating. The board 1, made in the form of a double-rib board, is provided with reinforcing ribs 13, 14 running lengthwise and crosswise to increase the rigidity, with reinforcing ribs 14 running along length L. A marginal area b of the board is kept free of the reinforcing ribs 14 along the lateral edges provided with the sliding margin g. Marginal edge b extends over an approximate length of 0.1 to 0.2 L. In the intermediate space of the double rib plate bridged by the reinforcing ribs 13, 14, gibs and cotters 2 are located in the vicinity of sliding margins g and serve to spread the individual boards of the double-rib board apart.

The structure of the metal-core PC board is clear from the partial cross section shown in FIG. 2. The core consists of two spaced metal plates 11, 12 connected together by reinforcing ribs 13, 14. On the outer surfaces of metal plates 11, 12, a copper-invar layer 32 is applied, on which a plastic cover layer 33 rests. The copper-invar layer is glued to the metal plates by an adhesive and the plastic cover layer is glued by an adhesive to the copper-invar layer. The plastic cover layer consists of a multilayer polyimide film, with a maximum of four film layers preferably being used. The sliding margin g of metal plates 11, 12 which is kept free of the coating, is indicated along the short lateral edges of the metal-core PC board. By means of this sliding margin 9, the metal-core PC board can be slid into suitably designed guide grooves in a housing. In FIG. 2 this housing is indicated by a dot-dashed line and given the reference numeral 5. The board can be secured in the guide grooves by virtue of the fact that the two metal plates 11, 12 can be spread apart in marginal area b, in each case with the help of a gib and cotter 2.

The gibs and cotters used consist of a plurality of wedges 22 resting on a screw bolt 21 and tensionable in the axial direction by means of the screw bolt 21, in the course of which action they spread themselves outward in accordance with the arrows shown in FIG. 2 (bottom) and are pressed against the inner surfaces of metal plates 11, 12. The gibs and cotters 2 can be provided as loose parts which must then be moved and tightened in the correct position and can be fastened unilaterally to one of metal plates 11, 12.

Figure 3:
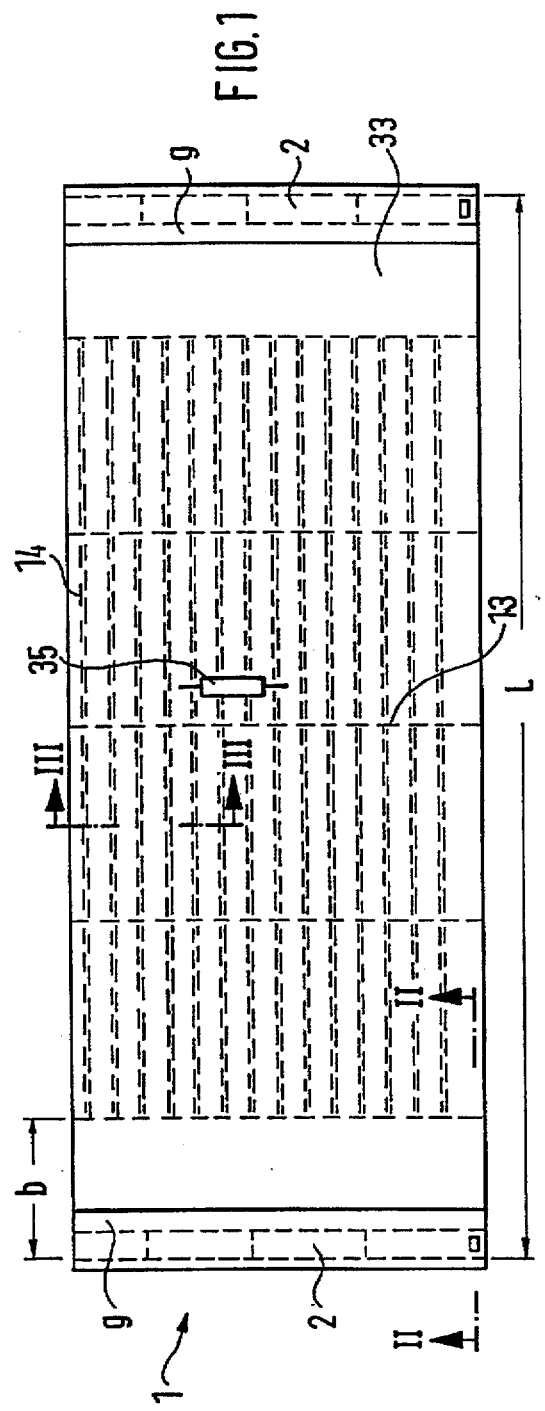
FIG. 3 is a partial section view through the PC board along Line III—III in FIG. 1.

The drawings shown considerably enlarged in FIGS. 2 and 3 are not to scale. The dimensions and layer thicknesses must be chosen in accordance with the following information. In one example of a metal-core PC board that is shown, the following advantageous dimensions have been selected: L=250 mm, a=5 mm, b=25 mm, g=12 mm, dd=5 mm, thickness of copper-invar layer=0.2 mm, thickness of plastic layer made of polyimide film=0.3 mm, with four film layers.

In addition to gluing, the cover layer made of a copper-invar layer and polyimide films can be secured by screws or rivets to metal plates 11, 12.

Advantageously, metal plates 11, 12 have a thickness d in a range from $1\times10^3$ to $5\times10^3$ L, where L is the long edge length of the board 1. Further, the spacing (a) of the metal plates 11, 12 is in the range from $1\times10^2$ to $5\times10^2$ L. Also, the copper-invar layer 32 is a sheet having a thickness in the range of from $4\times10^4$ to $12\times10^4$ L.

As shown in FIG. 2, the copper-invar layers 32 are glued using a silicon rubber adhesive 31 to the metal plates 11, 12. The cover layer 33 has a maximum of 4 film layers. Also, the thickness of the cover layer 33 is in the range from $1\times10^3$ to $2\times10^3$ L.

In preferred embodiments, along the lateral edges of the board 1 having the sliding margins g, the marginal area b equals 0.1 L to 0.2 L and is kept free of the reinforcing ribs.

In a further preferred embodiment, the gib and cotter 2 are fastened to one of the metal plates 11, 12.

We claim:

1. A metal-core PC board insertable into a housing of an electronic device, the metal-core PC board comprising:

a core comprising two metal plates spaced apart from one another and metal ribs connecting the two metal plates together, said core being formed of one of an aluminum and aluminum alloy;

copper-invar layers applied to the outer surfaces of said core;

a polyimide insulating layer composed of several layers applied to the copper-invar layers;

wherein said copper-invar layers and said polyimide insulating layer are arranged on the outer surface of said core such that sliding marginal areas of at least two opposite lateral edges of the metal-core PC board are not coated;

gibs and cotters arranged between the two metal plates in a vicinity of the sliding marginal areas such that the two metal plates are spread apart; and wherein the sliding marginal areas are free from any of said metal ribs.

2. The metal-core PC board according to claim 1, wherein each of the two metal plates have a thickness d in a range from $1\times10^3$ to $5\times10^3$ L, where L is a long edge length of the metal-core PC board.

3. The metal-core PC board according to claim 1, wherein a spacing between the two metal plates is in a range of from $1\times10^2$ to $5\times10^2$ L, where L is a long edge length of the metal-core PC board.

4. The metal-core PC board according to claim 1, wherein a spacing between the two metal plates is in a range of from $1\times10^2$ to $5\times10^2$ L.

5. The metal-core PC board according to claim 4, wherein each of the copper-invar layers is a sheet with a thickness in a range of from $4\times10^4$ to $12\times10^4$ L.

6. The metal-core PC board according to claim 1, wherein each of the copper-invar layers is a sheet with a thickness in a range of from $4\times10^4$ to $12\times10^4$ L, where L is a long edge length of the metal-core PC board.

7. The metal-core PC board according to claim 1, wherein the copper-invar layers are glued using a silicone rubber adhesive to the metal plates.

8. The metal-core PC board according to claim 1, wherein the polyimide insulating layer has a maximum of four film layers.

9. The metal-core PC board according to claim 1, wherein a thickness of the polyimide insulating layer is in a range of from $1\times10^3$ to $2\times10^3$ L, where L is a long edge length of the metal-core PC board.

10. The metal-core PC board according to claim 1, wherein the metal-core PC board, along the lateral edges with the sliding marginal areas, has a marginal area =0.1 L to 0.2 L, which is kept free of the metal ribs, where L is a long edge length of the metal-core PC board.

11. The metal-core PC board according to claim 1, wherein the gibs and cotters are fastened to one of the two metal plates.

* * * * *